United States Patent [19]

Hataishi et al.

[11] 4,376,664
[45] Mar. 15, 1983

[54] METHOD OF PRODUCING A SEMICONDUCTOR DEVICE

[75] Inventors: Osamu Hataishi, Yokohama; Yoshinobu Momma, Sagamihara, both of Japan

[73] Assignee: Fujitsu Limited, Kanagawa, Japan

[21] Appl. No.: 155,124

[22] Filed: May 30, 1980

[30] Foreign Application Priority Data

May 31, 1979 [JP] Japan .................................. 54-67612
May 31, 1979 [JP] Japan .................................. 54-67614

[51] Int. Cl.³ ...................... H01L 21/20; H01L 21/26
[52] U.S. Cl. ................................. 148/175; 29/576 W; 29/578; 148/187
[58] Field of Search ................... 29/571, 576 W, 578; 148/175, 187

[56] References Cited

U.S. PATENT DOCUMENTS

| | | | |
|---|---|---|---|
| 3,783,047 | 1/1974 | Paffen et al. | 148/1.5 X |
| 3,911,471 | 10/1975 | Kooi et al. | 148/175 X |
| 3,920,483 | 11/1975 | Johnson et al. | 148/1.5 |
| 4,004,044 | 1/1977 | Franco et al. | 427/43 |

OTHER PUBLICATIONS

Bersin et al., "The Dry Ox Process for Etching Silicon Dioxide", *Solid State Technology*, vol. 20, Apr. 1977, pp. 78-80.

*Primary Examiner*—G. Ozaki
*Attorney, Agent, or Firm*—Staas & Halsey

[57] ABSTRACT

In a case where a semiconductor device is produced comprising at least one semiconductor element, an isolation region surrounding the semiconductor element and a thick silicon oxide layer lying on and around the semiconductor element, the thick oxide layer is formed by thermal-oxidizing the epitaxial layer having a buried layer and, at the same time, the isolation region is formed in the epitaxial layer by heating for thermal oxidation. Prior to a step of introducing impurities into the epitaxial layer, the epitaxial layer is covered by an anti-oxidation masking layer, an insulating layer and a photo resist layer. Subsequent to the step of introducing impurities, the anti-oxidation masking layer is shaped into a pattern mask for the thermal-oxidation treatment.

9 Claims, 30 Drawing Figures

METHOD OF PRODUCING A SEMICONDUCTOR DEVICE

BACKGROUND OF THE INVENTION

1. Field of the Invention

The present invention relates to a method for producing a semiconductor device comprising at least one semiconductor element and an isolation region which are formed in an epitaxial layer formed on a semiconductor substrate. More particularly, the present invention relates to a method for forming both a silicon oxide layer which lies on and around the semiconductor element, and an isolation region which lies around the semiconductor element and has an opposite conductivity type to that of the epitaxial layer.

2. Description of the Prior Art

In the case where a semiconductor integrated circuit is produced by forming semiconductor elements, such as transistors, and passive elements, such as diffused resistors, in an epitaxial layer formed on a silicon semiconductor substrate, generally, after a silicon oxide layer is formed as a protecting layer on the surface of the integrated circuit, connecting lines of a conductor, such as aluminum, are formed on the silicon oxide layer. In this case, in order to decrease the parasitic capacity between the epitaxial layer and the aluminum connecting lines, the above-mentioned silicon oxide layer is made thick. Furthermore, in order to prevent a so-called parasitic effect from occuring between the semiconductor elements, an isolation region between the semiconductor elements is formed by introducing impurities having an opposite conductivity type to that of the epitaxial layer into a predetermined portion of the epitaxial layer.

A semiconductor element (e.g., an npn-type bipolar transistor) of an integrated circuit is illustrated in the schematic sectional view of FIG. 1. Such a bipolar transistor is illustrated in FIG. 2 of U.S. Pat. No. 3,911,471. In FIG. 1, reference numerals 1, 2, 2' and 3 indicate a p-type silicon substrate, an n-type silicon epitaxial layer, an isolated region and an n-type buried layer, respectively. The electrical resistance of the epitaxial layer 2 is high and, consequently, the breakdown voltage between the collector and the base of the bipolar transistor is high. The buried layer 3 can reduce the series resistance of the collector. Reference numerals 4, 5, 6, and 7 indicate a p-type base region, an n-type emitter region, an n-type collector connecting region and an isolation region, respectively. These regions 4, 5, 6, and 7 are formed in the epitaxial layer 2. Since the isolation region 7 has the opposite conductivity type to that of the epitaxial layer and surrounds the isolated region 2', it is possible to electrically isolate the bipolar transistor from other transistors and passive elements (not shown). Reference numerals 8, 8A through 8C, 9, 10, and 11 indicate a silicon oxide layer, thick portions of the silicon oxide layer, a collector electrode, a base electrode and an emitter electrode, respectively. The thick portions 8A, 8B and 8C of the silicon oxide layer 8 decrease the parasitic capacitance between the epitaxial layer and the connecting lines of the electrodes 9, 10 and 11. According to FIG. 1 the thick portions of the silicon oxide layer are separated, but the thick portions are distributed to form a repetitive pattern as indicated in FIG. 1.

The bipolar transistor illustrated in FIG. 1 is produced in the following manner. Referring to FIG. 2, the starting material is a p-type silicon semiconductor substrate 1. N-type impurities are introduced into a predetermined portion of the silicon substrate 1 by ion-implantation or thermal diffusion to form a buried layer 3. An n-type silicon epitaxial layer 2 is formed on the silicon substrate 1 by epitaxial growth and, at the same time, some impurities diffuse out of the buried layer 3 into the epitaxial layer 2, so that the buried layer 3 expands up to the dotted line in FIG. 2. A silicon nitride layer serving as an anti-oxidation masking layer is formed on the epitaxial layer 2 by chemical vapor deposition and, then, is selectively removed by photoetching, so that portions 12A, 12B and 12C of the silicon nitride layer remain, as illustrated in FIG. 2. If desired, a thin oxide layer may be provided under the silicon nitride layer.

Next, the semiconductor body comprising the silicon substrate 1 and the silicon epitaxial layer 2 is thermally oxidized at 1000° C. for approximately 2 hours. Since the silicon nitride layer portions 12A, 12B and 12C serve as an anti-oxidation mask during the oxidation period, a silicon dioxide ($SiO_2$) layer 13 having a thickness of approximately 700 nm is formed, as illustrated in FIG. 3.

The formed silicon dioxide layer 13 is removed by etching to expose a portion of the epitaxial layer 2. Then, the semiconductor body is again thermally oxidized at 1000° C. for approximately 8 hours to form a thick silicon dioxide layer 14 having a thickness of approximately 1.4 $\mu$m, as illustrated in FIG. 4.

Next, a photoresist layer (not shown) is applied on the entire surface and, then, a portion of the resist layer which lies on the silicon nitride layer portion 12A is removed. P-type impurities are introduced through the silicon nitride layer portion 12A into the epitaxial layer 2 by ion-implantation to form a high concentration region 15 of p-type impurities, as illustrated in FIG. 5. After the applied resist layer is removed, another photoresist layer is applied onto the entire surface, and then, a portion of the resist layer which lies on the silicon nitride layer portion 12B is removed. N-type impurities are introduced through the silicon nitride layer portion 12B into a portion of the epitaxial layer 2 by ion-implantation to form a high concentration region 16 of n-type impurities, as illustrated in FIG. 5.

The obtained semiconductor body is heated at 1100° C. for approximately 1 hour, whereby the p-type impurities in the high concentration regions 15 diffuse into the epitaxial layer 2 and arrive at the silicon substrate 1 to form an isolation region 7 for isolating semiconductor elements from each other and, at the same time, the n-type impurities in the high concentration region 16 diffuse and arrive at the buried layer 3 to form a collector connecting region 6, as illustrated in FIG. 6.

Next, the remaining silicon nitride layer portions 12A, 12B and 12C are removed to expose portions of the epitaxial layer 2. The obtained semiconductor body is thermally oxidized at 900° C. for approximately 30 minutes to form a thin silicon dioxide layer 8, having a thickness of approximately 50 nm, on the surfaces of the exposed portions of the epitaxial layer 2 including the isolation region 7 and the collector connecting region 6, as illustrated in FIG. 7. A patterned photoresist layer 17 is formed on the thin and thick silicon dioxide layers 8 and 14, as illustrated in FIG. 7. P-type impurities are introduced through a portion of the thin silicon dioxide layer 8 into a portion of the isolated region 2' of the epitaxial layer 2 by ion-implantation to form a high concentration region 18 of the p-type impurities.

The obtained semiconductor body is annealed by heating at 1000° C. for approximately 10 minutes, whereby the impurities in the high concentration region 18 diffuse to a predetermined depth in the epitaxial layer 2, so that a base region 5 is formed, as illustrated in FIG. 8. Then, N-type impurities are introduced into a portion of the base region 4 by ion-implantation subsequent to etching of a portion of the thin silicon dioxide layer lying on the base region 4 by photoetching. An annealing treatment is carried out at 1000° C. for approximately 20 minutes to form an emitter region 4, as illustrated in FIG. 1.

Openings for the collector electrode 9 and for the base electrode 11 are formed in the thin silicon dioxide layer above the collector connecting region 6 and the base region 4, respectively, by photoetching, as illustrated in FIG. 1. Finally, a conductor layer of aluminum is formed on the entire surface by vapor deposition and, then, is selectively removed by photoetching to form the collector, base and emitter electrodes 9, 11 and 10, respectively. In the above described manner, a npn-type bipolar transistor isolated from other elements is produced, as illustrated in FIG. 1.

However, when the thick silicon dioxide layer 14 (FIG. 4) is formed prior to the introduction of impurities into the epitaxial layer 2, a portion of the epitaxial layer lying under the silicon nitride layer portions 12A, 12B and 12C is oxidized into silicon dioxide. Namely, a portion of the thick silicon dioxide layer 14 enters under the silicon nitride layer portions to form a so-called bird's beak, as illustrated in FIG. 4. Since the bird's beak of silicon dioxide prevents the impurities from entering into the epitaxial layer 2, for example, in order to form the isolation region 7 having a width of 1 μm, it is necessary to make the width of the silicon nitride layer portion 12A approximately 3 μm. As the width of the silicon nitride layer portion 12A increases, on the one hand, its area increases, and on the other hand, the area for semiconductor elements and passive elements of the integrated circuit decreases. Therefore, it is difficult to increase the degree of integration of the semiconductor elements and the passive elements in the integrated circuit.

Furthermore, according to the above-mentioned production method, the method comprises the step of forming the thick silicon dioxide layer, and the step of diffusing the impurities for forming the isolation region and the collector connecting region, namely, a heat-treatment is carried out at least two times. When the heat-treatment is repeated, the impurities in the buried layer diffuse upward in the epitaxial layer. As the result of this, the breakdown voltage between the collector and the emitter decreases.

SUMMARY OF THE INVENTION

An object of the present invention is to increase the degree of integration of semiconductor elements and passive elements in an integrated circuit over that of the prior art and to prevent the breakdown voltage between the collector and the base of a bipolar transistor from decreasing, by providing an improved method for producing a semiconductor device comprising at least one semiconductor element and an isolation region which are formed in an epitaxial layer formed on a semiconductor substrate.

The present invention is based on recognition of the two facts that, where impurities are introduced into the epitaxial layer prior to the step of forming a thick oxide layer by thermal oxidation, the design of an integrated circuit (i.e., the shapes and dimensions of the semiconductor elements, the passive elements and the isolation region) can prevent the formation of a bird's beak of the thick oxide layer, and that a formation step of the thick oxide layer and a formation step of the isolation region can be carried out in one heat-treatment.

According to the present invention, a method of producing a semiconductor device comprising at least one semiconductor element and an isolation region, which are formed in an epitaxial layer formed on a semiconductor substrate having a buried layer, comprises the steps of:

forming an anti-oxidation masking layer on the epitaxial layer;

forming an insulating layer on the anti-oxidation masking layer;

forming a patterned resist layer;

introducing the impurities into the predetermined portion of the epitaxial layer which is not under the patterned resist layer;

removing the patterned resist layer;

making a pattern mask out of the anti-oxidation masking layer; and selectively thermally oxidizing the epitaxial layer to form a thick oxide layer, at the same time the introduced impurities are diffused into the epitaxial layer to form the isolation region.

DESCRIPTION OF THE PREFERRED EMBODIMENTS

The present invention will now be explained in detail by the following embodiments A through F with reference to the drawings.

EMBODIMENT A

Figure 9:
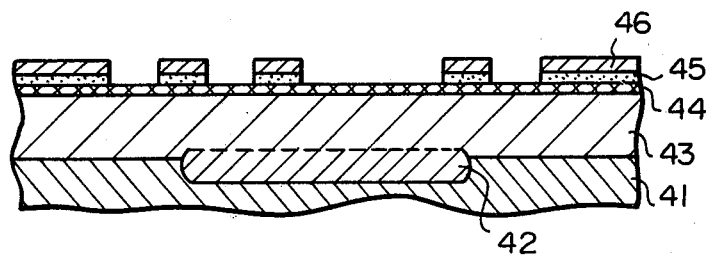
FIGS. 9 through 16 are schematic sectional views of a bipolar transistor in intermediate stages of production in accordance with an embodiment A of the present invention.

Referring to FIG. 9, the starting material is a p-type silicon semiconductor substrate 41 having an n+-type buried layer 42. An n-type silicon epitaxial layer 43, having a high resistance, is formed on the silicon substrate 41 and, at the same time, some n-type impurities diffuse out of the buried layer 42 into the epitaxial layer 43, so that the buried layer 42 expands up to a broken line in FIG. 9. A silicon nitride layer 44 having a thickness of approximately 50 nm and serving as an anti-oxidation masking layer is formed on the epitaxial layer 43 by chemical vapor deposition. A silicon oxide layer (i.e., an insulating layer) 45 having a thickness of approximately 500 nm is formed on the silicon nitride 44 by chemical vapor deposition. Furthermore, a negative photoresist layer 46 is applied onto the silicon oxide layer 45. The negative photoresist layer 46 is exposed and developed to form a patterned negative resist layer 46. Then, using the patterned negative resist layer 46 as a mask, the silicon oxide layer 45 is selectively etched by an aqueous solution of hydrofluoric acid, as illustrated in FIG. 9.

Figure 10:
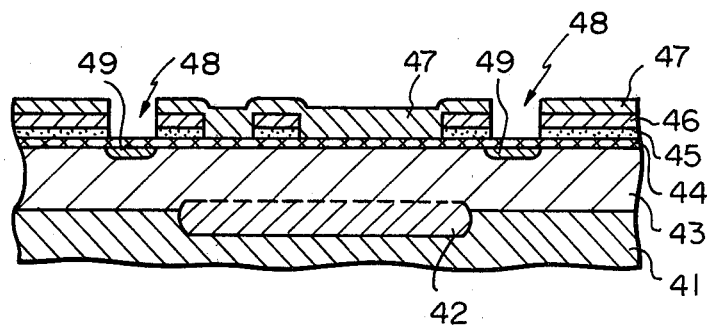

Next, a positive photoresist layer 47 is applied onto the entire surface including the exposed portions of the silicon nitride layer 44 and the patterned negative resist layer 46. The positive resist layer 47 is exposed and developed to form an opening 48, as illustrated in FIG. 10. P-type impurities (e.g., boron) are introduced through a portion of the silicon nitride layer exposed within the opening 48 into the epitaxial layer 43 by ion-implantation to form a high concentration region 49 (FIG. 10) of p-type impurities.

Figure 11:
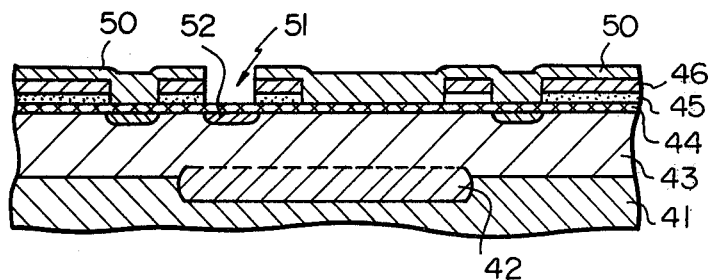

After the positive photoresist layer 47 is removed, another positive photoresist layer 50 is applied onto the entire surface of the exposed portions of the silicon nitride layer 44 and the patterned negative photoresist layer 46 and, then, is exposed and developed to form another opening 51, as illustrated in FIG. 11. N-type impurities (e.g., phosphorus) are introduced through a portion of the silicon nitride layer 44 exposed within the opening 51 into the epitaxial layer 43 by ion-implantation to form a high concentration region 52 (FIG. 11) of n-type impurities.

Figure 12:
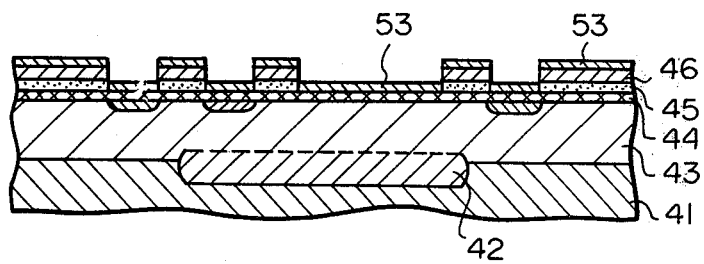

Next, the positive photoresist layer 50 is removed, but the patterned negative photoresist layer 46 remains. A metal layer 53 is formed on the entire surface including the exposed portion of the silicon nitride layer 44 and the remaining negative photoresist layer 46 by vapor deposition, as illustrated in FIG. 12. The metal layer 53 is made of molybdenum (Mo), chromium (Cr), platinum (Pt) or polysilicon, preferably molybdenum, and has a good corrosion resistance against an etching solution of pyrophosphoric acid for silicon nitride or of hydrofluoric acid for silicon oxide or against plasma etching.

Figure 13:
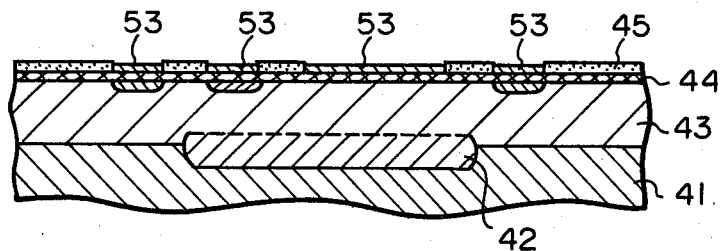

The patterned negative photo resist layer 46 is removed by a suitable remover, and, at the same time, a portion of the metal layer 53 lying on the patterned resist layer 46 is removed, as illustrated in FIG. 13. Such a removing process of a portion of the metal layer is generally called a lift off process.

Figure 14:
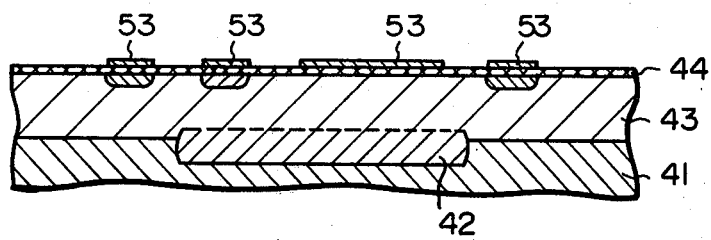

Next, using the remaining metal layer 53 as a mask, the remaining silicon oxide layer 45 is etched by a solution of hydrofluoric acid, as illustrated in FIG. 14. It is also possible to carry out a lift off process which comprises the steps of:

removing the negative photo resist layer 46 prior to the step of forming the positive photo resist layer 47;

forming a metal layer on the exposed portions of the silicon nitride layer 44 and the remaining silicon dioxide layer 45 subsequent to the impurity introducing step; and;

removing the silicon dioxide layer 45 together with a portion of the metal layer thereon.

Figure 15:
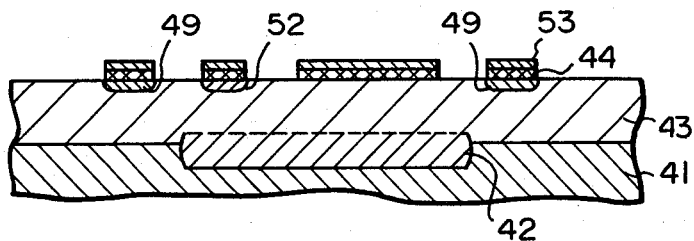

Using also the remaining metal layer 53 as a mask, a portion of the silicon nitride layer 44 is selectively etched by a solution of pyrophosphoric acid to expose a portion of the epitaxial layer 43, as illustrated in FIG. 15.

Figure 16:
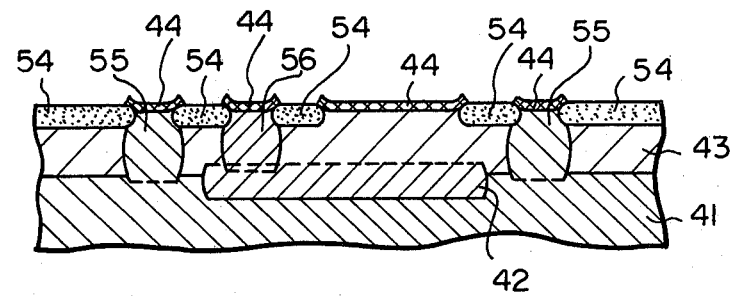

After the remaining metal layer 53 is removed by a mixed solution of nitric acid and hydrochloric acid, the obtained semiconductor body comprising the substrate 41 and the epitaxial layer 43 is heated at 1100° C., for approximately 2 hours, in an oxidizing atmosphere. As a result of the heat-treatment, i.e., a thermal oxidation treatment, the exposed portion of the epitaxial layer 43 is oxidized to form a thick silicon oxide layer 54 having a thickness of approximately 1 $\mu$m, the p-type impurities in the high concentration region 49 diffuse into the epitaxial layer 43 and arrive at the silicon substrate 41 to form an isolation region 55 and, simultaneously, the n-type impurities in the high concentration region 52 diffuse and arrive at the buried layer 42 to form a collector connecting region 56, as illustrated in FIG. 16.

Thus, since the formation of the thick silicon oxide layer, the isolation region and the collector connecting region are simultaneously carried out, the number of heat treatments is decreased as compared with the abovementioned prior art method of producing a semiconductor device. Therefore, the decrease in the breakdown voltage between the collector and the base caused by diffusing the n-type impurities out of the buried layer into the epitaxial layer is smaller than in the prior art.

In order to complete a bipolar transistor, a base region, an emitter region, a collector electrode, a base electrode, an emitter electrode and a required thin silicon oxide layer are formed in the same manner as in the abovementioned prior art method.

In this embodiment, a photoetching technique (i.e., photolithography) is used, but, an electron beam lithography, an ion beam lithography or an X-ray lithography may be used.

EMBODIMENT B

Figure 17:
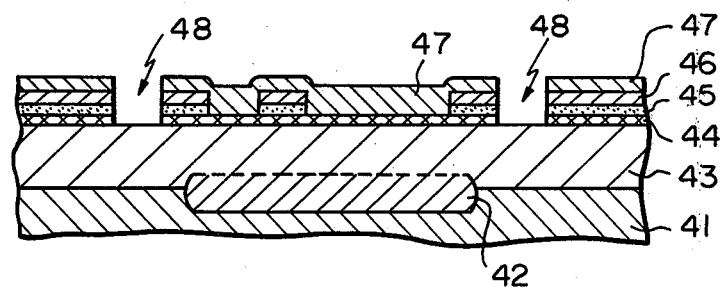
FIGS. 17 and 18 are schematic sectional views of a bipolar transistor in intermediate stages of production in accordance with an embodiment B of the present invention.
Figure 18:
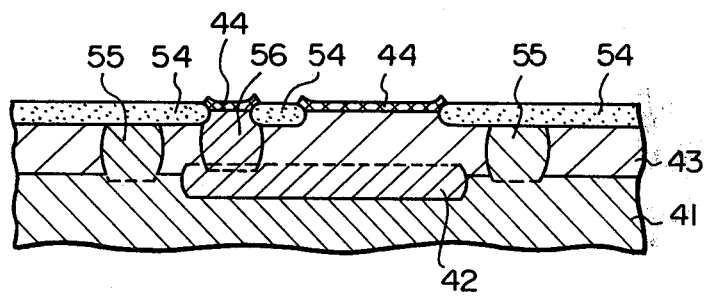

Subsequent to the step of forming the opening 48 (FIG. 10) and prior to the step of introducing the p-type impurities of the embodiment A, a portion of the silicon nitride layer 44 exposed within the opening 48 can be etched by plasma etching, as illustrated in FIG. 17. Therefore, the p-type impurities can be directly introduced into an exposed portion of the epitaxial layer 43. The procedure for producing a semiconductor device in this embodiment, except for the above-mentioned etching step, is the same as that of the embodiment A. As a result, the semiconductor body in the state illustrated in FIG. 18 is obtained. The thick silicon oxide layer 54 is formed on the isolation region 55, whereby the parasitic capacity between a connecting line and the isolation region can be decreased.

EMBODIMENT C

Figure 19:
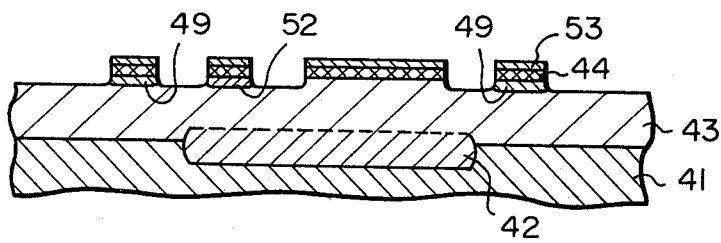
FIGS. 19 and 20 are schematic sectional views of a bipolar transistor in intermediate stages of production in accordance with the embodiment C of the present invention.
Figure 20:
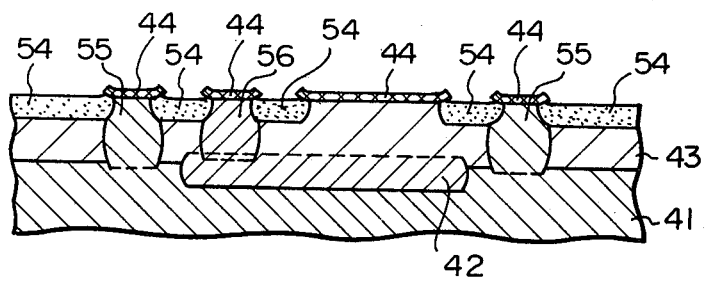

Subsequent to the step of etching the portion of the silicon nitride layer 44 (refer to FIG. 15) of the embodiment A, a portion of the epitaxial layer 43 can be etched by plasma etching, as illustrated in FIG. 19. Then, the metal layer 53 is etched by the above-mentioned etchant. The obtained semiconductor body is treated in the same conditions as those of the heat-treating step of the embodiment A to obtain the semiconductor body in the state illustrated in FIG. 20. The difference between the levels of the surface of the thick silicon oxide layer 54 (FIG. 20) and the surface of the epitaxial layer 43 (FIG. 20) is smaller as compared with that of the semiconductor body in the state illustrated in FIG. 16 for the case of the embodiment A.

Figure 29:
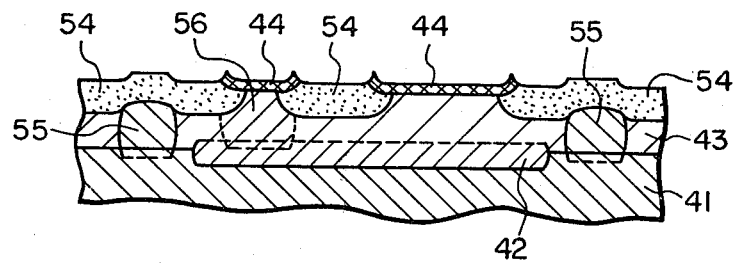
FIGS. 29 and 30 are schematic sectional views of a bipolar transistor in intermediate stages of production in accordance with variant combinations of the embodiments A, B and C.
Figure 30:
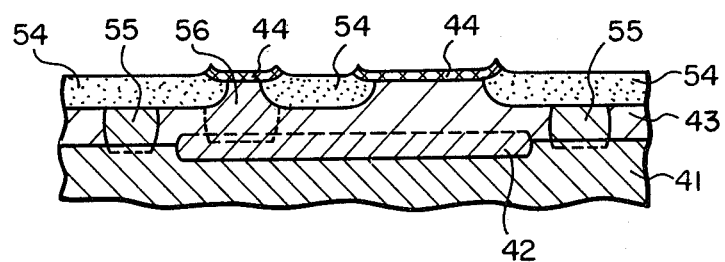

Furthermore, it is possible to combine the above-mentioned embodiments B and C, as the result of which the semiconductor body structure illustrated in FIG. 29 can be obtained. The combination of the embodiments B and C can further include the step of etching a portion of the epitaxial layer corresponding to the isolation region prior to the step of introducing p-type impurities, as the result of which the semiconductor body structure illustrated in FIG. 30 can be obtained.

EMBODIMENT D

Figure 21:
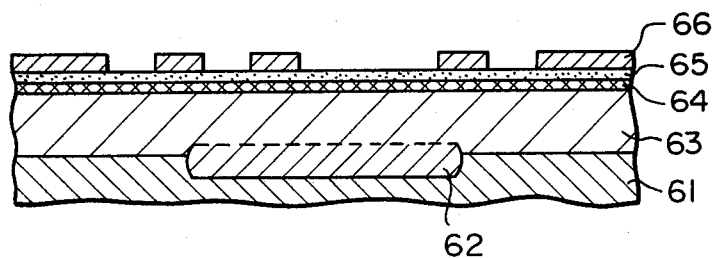
FIGS. 21 to 27 are schematic sectional views of a bipolar transistor in intermediate stages of production in accordance with an embodiment D of the present invention.

Referring to FIG. 21, the starting material is a p-type silicon semiconductor substrate 61 having an $n^+$-type buried layer 62. A n-type silicon epitaxial layer 63, having a high resistance, is formed on the silicon substrate 61 and, at the same time, some n-type impurities diffuse out of the buried layer 62 into the epitaxial layer 63, so that the buried layer 62 expands up to the dotted line in FIG. 21. A silicon nitride layer 64 having a thickness of approximately 50 nm and serving as an anti-oxidation masking layer is formed on the epitaxial layer 63 by chemical vapor deposition. A silicon oxide layer (i.e., an insulating layer) 65 having a thickness of approximately 50 nm is formed on the silicon nitride layer 64 by chemical vapor deposition. Furthermore, an negative photo resist layer 66 is applied onto the silicon oxide layer 45 and, then, is exposed and developed to form a patterned negative resist layer 66, as illustrated in FIG. 21.

Figure 22:
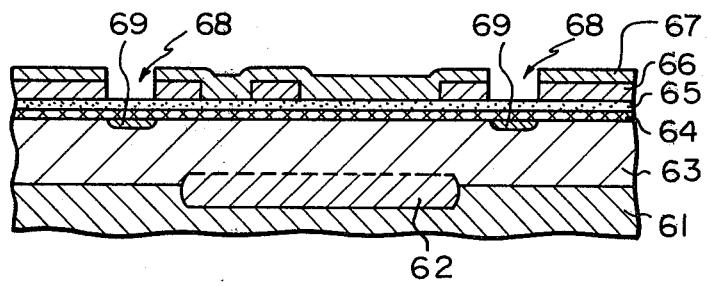

Next, a positive photo resist layer 67 is applied onto the entire surface including the exposed portions of the silicon dioxide layer 65 and the patterned negative resist layer 66. The positive resist layer 67 is exposed and developed to form openings 68, as illustrated in FIG. 22. P-type impurities (e.g., boron) are introduced through the openings 68, through the silicon dioxide layer 65 and through the silicon nitride layer 64 into the epitaxial layer 63 by ion-implantation to form a high concentration region 69 (FIG. 22) of p-type impurities.

Figure 23:
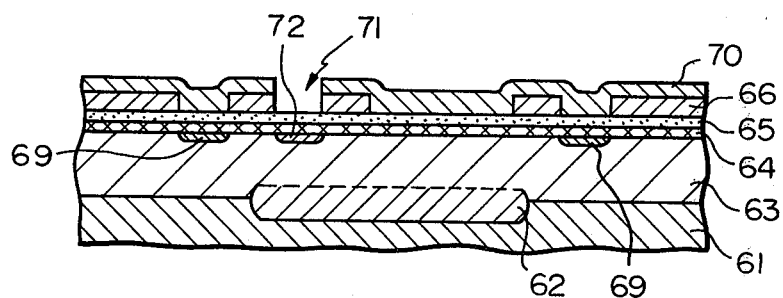

After the positive photo resist layer 67 is removed, another positive photo resist layer 70 is applied onto the exposed silicon dioxide layer 65 and the patterned negative resist layer 66 and, then, the positive photoresist layer 70 is exposed and developed to form another opening 71, as illustrated in FIG. 23. N-type impurities (e.g., phosphorus) are introduced through the opening 71, through the silicon dioxide layer 65 and through the silicon nitride layer 64 into the epitaxial layer 63 by ion-implantation to form a high concentration region 72 (FIG. 23) of n-type impurities.

Figure 24:
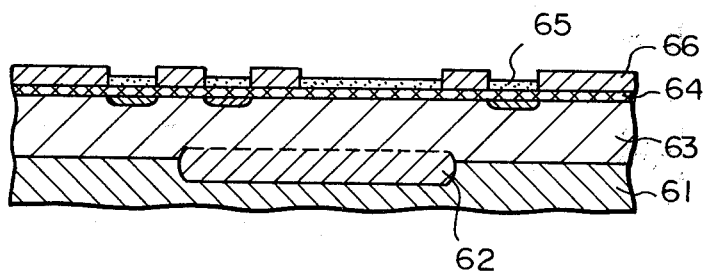

After the positive resist layer 70 is removed, the obtained semiconductor body comprising the silicon substrate 61 and the epitaxial layer 63 is placed in a reaction tube (not shown) heated at 150° C. Hydrogen fluoride (HF) gas flows through the reaction tube at the flow rate of approximately 10 l/min for approximately 30 minutes. Since the hydrogen fluoride reacts with the water content of the patterned negative resist layer 66 to produce hydrofluoric acid, the hydrofluoric acid etches a portion of silicon dioxide layer 65 lying under the patterned negative resist layer 66, as illustrated in FIG. 24. Such etching process is a so-called "DryOx process" (ref. Reichard L. Bersin and Reichard F. Reichelderfer, "The DryOx Process For Etching Silicon Dioxide", Solid State Technology, April (1977), pp. 78–90).

Figure 25:
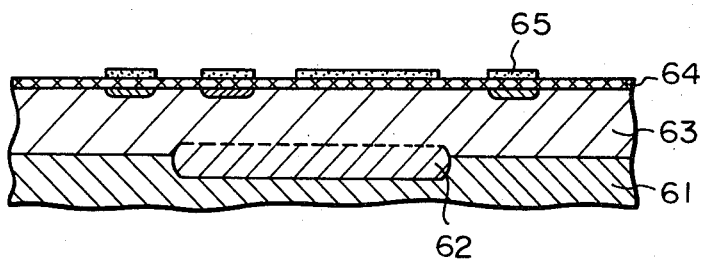

Next, the negative photo resist layer 66 is removed, and thus the patterned silicon dioxide layer 65 remains, as illustrated in FIG. 25.

Figure 26:
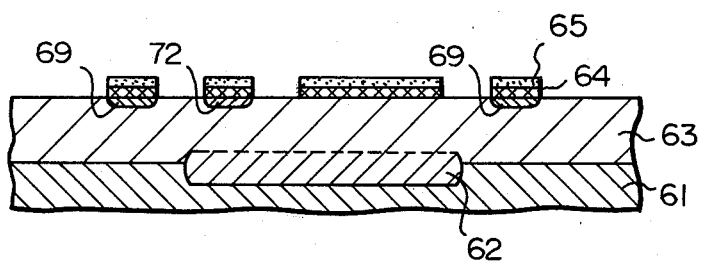

Using the patterned silicon dioxide layer 65 as a mask, the silicon nitride layer 64 is selectively etched by a pyrophosphoric acid solution to expose a portion of the epitaxial layer 63, as illustrated in FIG. 26.

Figure 27:
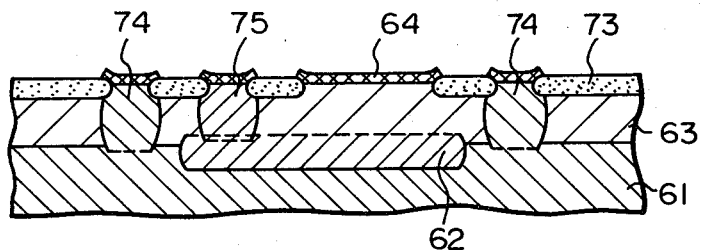

After the patterned silicon dioxide layer 65 is removed by an etchant, i.e., a solution of hydrofluoric acid, the obtained semiconductor body is heated at 1100° C., for approximately 2 hours, in an oxidizing atmosphere. As a result of this thermal oxidation treatment, the exposed epitaxial layer 63 is oxidized to form a thick silicon dioxide layer 73 having a thickness of approximately 1 $\mu$m, the p-type impurities in the high concentration region 69 diffuse into the epitaxial layer 63 and arrive at the silicon substrate 61 to form an isolation region 74 and, simultaneously, the n-type impurities in the high concentration region 72 diffuse and arrive at the buried layer 62 to form a collector connecting region 75, as illustrated in FIG. 27. The obtained semiconductor body illustrated in FIG. 27 is the same as that illustrated in FIG. 16 in the case of the embodiment A. Therefore, the advantages mentioned above for the embodiment A are also obtained in this embodiment D.

EMBODIMENT E

Figure 28:
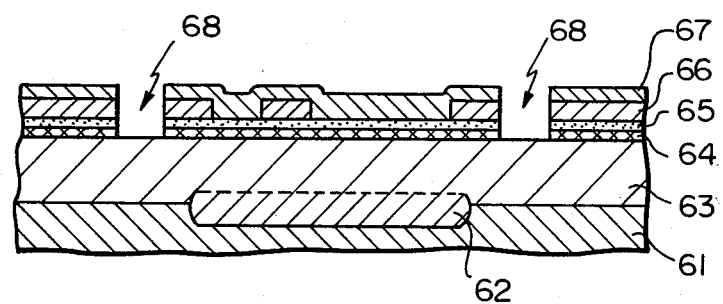
FIG. 28 is a schematic sectional view of a bipolar transistor in an intermediate stage of production in accordance with an embodiment E of the present invention.

Subsequent to the step of forming the opening 68 (FIG. 22) and prior to the step of introducing the p-type impurities of the embodiment D, portions of the silicon dioxide layer 65 and silicon nitride layer 64 within the opening 68 can be etched by plasma etching, as illustrated in FIG. 28. The procedure of treating steps in this embodiment, except for the above-mentioned etching step, is the same as that of the embodiment D. As a result, the semiconductor body in the state illustrated in FIG. 18 can be obtained.

EMBODIMENT F

Subsequent to the step of etching the silicon nitride layer 64 (refer to FIG. 26) of the embodiment D, a portion of the epitaxial layer 63 can be etched by plasma etching to obtain the semiconductor body having a structure similar to that of the semiconductor body illustrated in FIG. 19. Then, the steps of removing the patterned silicon dioxide layer 65 and heating in the oxidizing atmosphere of the embodiment D are carried out to obtain the semiconductor body in the state illustrated in FIG. 20.

Furthermore, in a case where the length of the thick silicon dioxide portion 8C (FIG. 1), namely, the distance between the isolation region 7 and the base region 4 (FIG. 1) is 2 $\mu$m or less, the punch through phenomenon often occurs, when a depletion layer extending from the base region-epitaxial layer interface into the isolated region 2' (FIG. 1) is joined to a depletion layer extending from the isolation region-epitaxial layer interface into the isolated region 2'. The punch through phenomenon generates an undesirable leakage current. In order to prevent the punch through phenomenon from occuring, it is preferable to introduce n-type impurities (a dose of $5 \times 10^{12}$ atoms/cm$^2$ at an energy of 60 KeV) into a portion of the epitaxial layer 2 lying under the silicon dioxide layer portion 8C by ion-implantation prior to the step of forming the thick silicon dioxide layer portion 8C.

It will be obvious that the present invention is not restricted to the above-mentioned embodiments, and that many variations are possible for those skilled in the art without departing from the scope of the present invention. For example, it is possible to produce a pnp-type bipolar transistor instead of the npn-type bipolar transistor. An anti-oxidation masking layer may be made of silicon carbide instead of silicon nitride.

We claim:

1. A method of producing a semiconductor device comprising at least one bipolar transistor and an isolation region which are formed in an epitaxial layer formed on a semiconductor substrate having a buried layer, said method comprising, in sequence, the steps of:
   (A) forming a layer capable of masking against oxidation on said epitaxial layer,
   (B) forming an insulating layer on said anti-oxidation masking layer,
   (C) forming a patterned negative resist layer on said insulating layer,
   (D) selectively etching said insulating layer by using said negative resist layer as a mask,
   (E) introducing a first impurity into a first predetermined portion of said epitaxial layer corresponding to the isolation region by using a first patterned positive resist layer as a mask,
   (F) introducing a second impurity through said masking layer into a second predetermined portion of said epitaxial layer corresponding to a collector-connecting-region of the bipolar transistor by using a second patterned positive resist layer as a mask,
   (G) removing said positive resist mask,
   (H) forming a metal layer over the whole exposed surface,
   (I) removing said patterned negative resist layer and the portion of said metal layer thereon,
   (J) etching the remaining portion of the insulating layer and the portion of said anti-oxidation layer lying thereunder by using the remaining layer as a mask,
   (K) removing said remaining metal layer,
   (L) selectively thermal-oxidizing said epitaxial layer by using the remaining anti-oxidation masking layer as a pattern mask to form a thick oxide layer, while at the same time diffusing said introduced first and second impurities into said epitaxial layer to form said isolation region and said collector region in contact with said buried layer, respectively, and
   (M) forming a base region and an emitter region of the bipolar transistor in a portion of said epitaxial layer above said buried layer.

2. The method of claim 1, wherein said first impurity for said isolation region is introduced through said masking layer.

3. The method of claim 1, wherein said first impurity for said isolation region is directly introduced into said portion of said epitaxial layer, after a portion of said masking layer on said portion of the epitaxial layer is removed by etching by using said first patterned positive resist layer as a mask.

4. The method of claim 2 or 3, comprising the step of etching a portion of said epitaxial layer prior to said step (K) of removing the remaining metal layer.

5. The method of claim 3, comprising the step of etching a portion of said epitaxial layer prior to said step of introducing the first impurity for said isolation region.

6. A method of producing a semiconductor device comprising at least one bipolar transistor and an isolation region which are formed in an epitaxial layer formed on a semiconductor substrate having a buried layer, said method comprising, in sequence, the steps of:
   (A) forming a layer capable of masking against oxidation on said epitaxial layer,
   (B) forming an insulating layer on said anti-oxidation masking layer,
   (C) forming a patterned negative resist layer on said insulating layer,
   (D) introducing a first impurity into a first predetermined portion of said epitaxial layer corresponding to the isolation region by using a first patterned positive resist layer as a mask,
   (E) introducing a second impurity through said insulating and masking layers into a second predetermined portion of said epitaxial layer corresponding to a collector-connecting-region of the bipolar transistor by using a second patterned positive resist layer as a mask,
   (F) etching the portion of said insulating layer which is covered with said patterned negative resist layer by using a reaction between the water content of said negative resist layer and hydrogen fluoride gas,
   (G) removing said negative resist layer,
   (H) etching said anti-oxidation masking layer by using the remaining insulating layer as a mask,
   (I) removing said remaining insulating layer,
   (J) selectively thermally oxidizing said epitaxial layer to form a thick oxide layer, while at the same time diffusing said introduced first and second impurities into said epitaxial layer to form said isolation region and said collector-connecting-region in contact with said buried layer, respectively, and
   (K) forming a base region and an emitter region of the bipolar transistor in a portion of said epitaxial layer above said buried layer.

7. The method of claim 6, wherein said first impurity for said isolation region is introduced through said insulating and masking layers.

8. The method of claim 6, wherein said first impurity for said isolation region is directly introduced into said portion of said epitaxial layer, after portions of said insulating and masking layers are removed by etching by using said first patterned positive resist layer as a mask.

9. The method of claim 6, further comprising the step of etching a portion of said epitaxial layer subsequent to said step (H) of etching said anti-oxidation masking layer.

* * * * *

UNITED STATES PATENT AND TRADEMARK OFFICE
CERTIFICATE OF CORRECTION

PATENT NO. : 4,376,664
DATED : 15 March 1983
INVENTOR(S) : Hataishi et al

It is certified that error appears in the above-identified patent and that said Letters Patent is hereby corrected as shown below:

Front page, [57] ABSTRACT,
　　　line 1, "In a case where" should be --Where--;
　　　line 2, "element," should be --element with--;
　　　line 6, "thermal-oxidizing" should be --thermally oxidizing--;
　　　line 8, after "by" insert --diffusion during the--; after "for" insert --the--.

Figure 1:
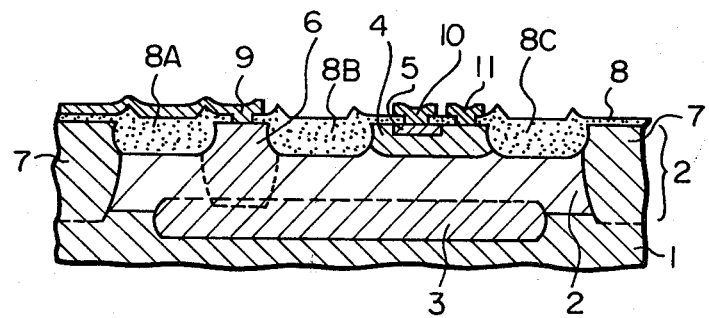
FIG. 1 is a schematic sectional view of a prior art bipolar transistor of an integrated circuit.
Figure 2:
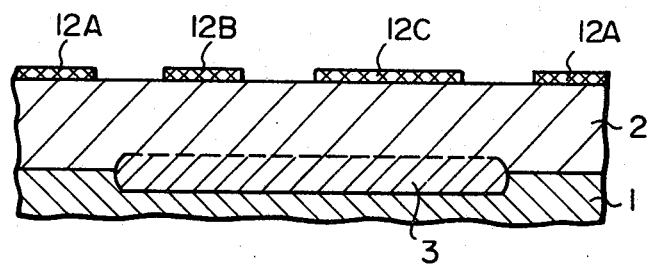
FIGS. 2 through 8 are schematic sectional views of the bipolar transistor of FIG. 1 in intermediate stages of production in accordance with prior art techniques.
Figure 3:
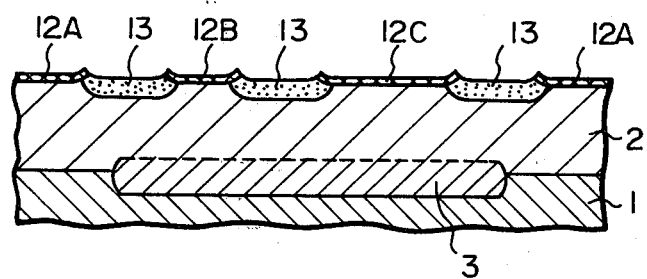
Figure 4:
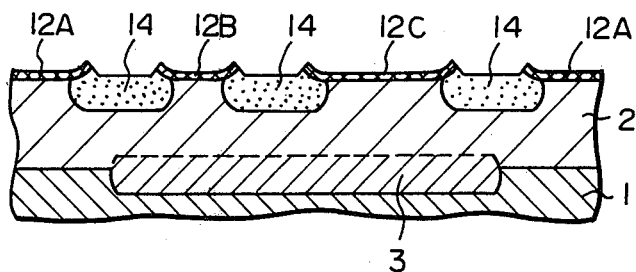
Figure 5:
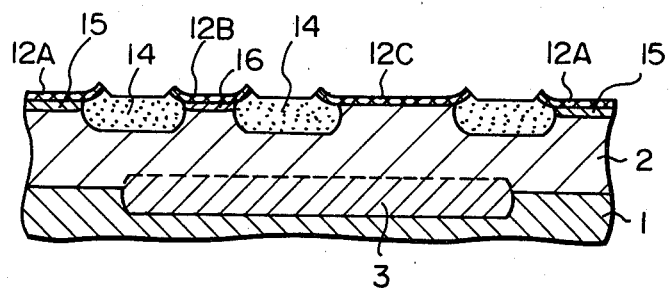
Figure 6:
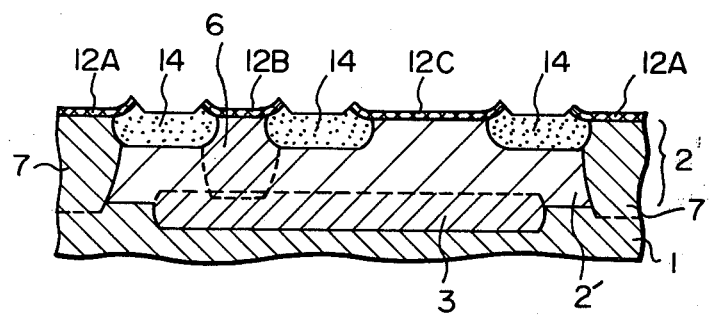
Figure 7:
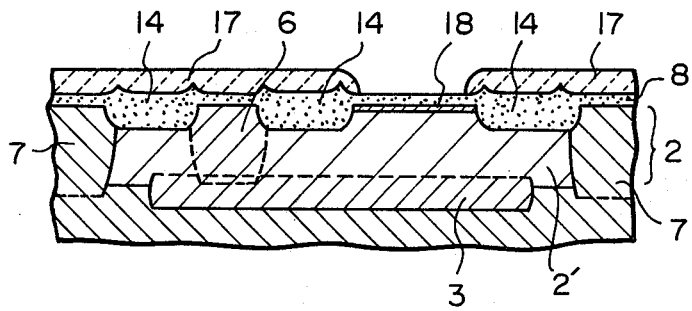
Figure 8:
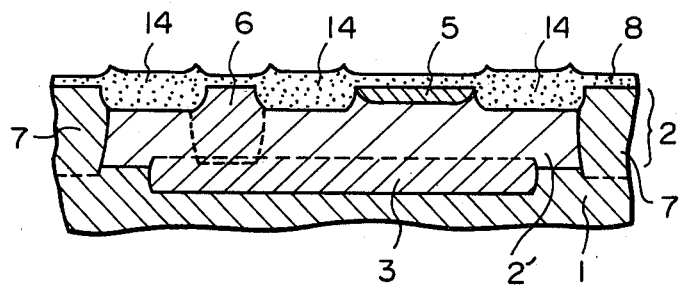

In the Drawings:
　　　In Fig. 1, "2" (bottom right) should be --2'--.
　　　In Fig. 8, "5" should be --4--.

Column 3, 　　line 7, "5" should be --4--;
　　　　　　line 13, "4" should be --5--;
　　　　　　line 23, "a" should be --an--.

Column 6, 　　line 7, "step; and;" should be --step; and--.

Column 8, 　　line 7, after "of" insert --the--.

Signed and Sealed this

Thirteenth Day of March 1984

[SEAL]

Attest:

GERALD J. MOSSINGHOFF

Attesting Officer　　Commissioner of Patents and Trademarks